(12) United States Patent
Park

(10) Patent No.: US 6,787,274 B2
(45) Date of Patent: Sep. 7, 2004

(54) MASK FOR ADJUSTING TRANSMITTANCE OF A LIGHT AND METHOD FOR MANUFACTURING THE SAME

(75) Inventor: Chul-Hong Park, Yongin-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 224 days.

(21) Appl. No.: 10/118,916

(22) Filed: Apr. 10, 2002

(65) Prior Publication Data

US 2002/0150824 A1 Oct. 17, 2002

(30) Foreign Application Priority Data

Apr. 11, 2001 (KR) ........................................ 2001-19151

(51) Int. Cl.[7] .............................................. G03F 9/00
(52) U.S. Cl. ......................................................... 430/5
(58) Field of Search ........................... 430/5, 322, 396; 438/487, 784

(56) References Cited

U.S. PATENT DOCUMENTS 5,242,770 A   9/1993   Chen et al. .................... 430/5
5,597,668 A * 1/1997   Nowak et al. ................. 430/5
6,258,489 B1 * 7/2001  Stanton et al. ................ 430/5

OTHER PUBLICATIONS

C.H. Park, et al. "A Systematic Approach to Correct Critical Patterns, etc . . . " Proc. SPIE vol. 3679 (1999).

* cited by examiner

Primary Examiner—S. Rosasco
(74) Attorney, Agent, or Firm—Lee & Sterba, P.C.

(57) ABSTRACT

A transmittance adjustment mask includes a plurality of features and dummy features that correspond to circuit elements of integrated circuits, and uses an exposure device to optically transcribe a pattern corresponding to the integrated circuits onto a semiconductor substrate. The features have predetermined minimum dimensions and include an isolated edge and a plurality of dense edges. The dummy features are spaced apart and parallel from a corresponding isolated edge by a predetermined distance such that a light intensity in the dense edges and the isolated edges of the plurality of features are about the same. The dummy features adjust the amount of light radiated to peripheral areas of the isolated edges to match that radiated to peripheral areas of the dense edges, thereby reducing the difference of dimensions between densely packed features and isolated features transcribed onto the semiconductor substrate.

22 Claims, 9 Drawing Sheets

MASK FOR ADJUSTING TRANSMITTANCE OF A LIGHT AND METHOD FOR MANUFACTURING THE SAME

BACKGROUND OF THE INVENTION

1. Field of the Invention

The present invention relates to a mask for adjusting transmittance of a light and a method for manufacturing the same. More particularly, the present invention relates to a mask having dummy features formed at peripheries of isolated edges of features corresponding to each circuit element of an integrated circuit to correct the optical proximity effect (OPE) and a method for manufacturing the same.

2. Description of the Related Art

As the minimum design rule of devices integrated in a semiconductor chip and connecting wires is reduced, a conventional lithography technique using an ultraviolet ray is not able to prevent distortion of a pattern formed in a wafer.

That is, although an i-ray and a deep ultraviolet ray (DUV ray) have wavelengths of 248 nm, a minimum design rule thereof is 190 nm, so distortion of the pattern is caused by diffraction and interruption of light during a semiconductor device manufacturing process.

The distortion of the pattern becomes more serious as the minimum design rule is reduced. Accordingly, correction is required for pattern distortion that occurs in a photolithography process due to a resolution limitation.

In a conventional photolithography process, a pattern of a photo mask is copied onto a wafer through an optical lens. Since an optical system for projecting an image acts as a low-band filter, the image formed on the wafer is distorted as compared with an original shape. When a rectangular-shaped mask is used, a circular pattern is formed on the wafer since the high-frequency light components do not pass through the edges of the rectangular-shaped mask. When the mask pattern is large, a basic spatial frequency is lowered, so the relatively high degree frequency may be transmitted through the mask, and the image formed on the wafer is substantially identical to the original image. However, when the pattern is small, the spatial frequency becomes high, so the transmission ratio is reduced and serious distortion occurs.

In an attempt to solve the problem described above, variations in lithography equipment have been developed, but these variations have limited effectiveness.

For this reason, an optical proximity correction (OPC) is suggested. According to optical proximity correction, the shape of the mask is pre-deformed, taking into consideration the distortion of the pattern, so that the image formed on the wafer is the desired image.

Optical proximity correction may be achieved when adjacent features are interacted with each other such that a pattern-dependent alteration is created. That is, lines designed to have the same dimensions and different proximities from other features have different dimensions from each other after the developing process has been finished. Accordingly, densely arranged lines are transcribed differently from more widely spaced lines. If the line width is not constant, serious problems may occur in an integrated chip.

In order to reduce the variation of a critical dimension (CD) caused by the optical proximity effect, a method for optimizing parameters of an exposure device and an OPC method are used.

Figure 1:
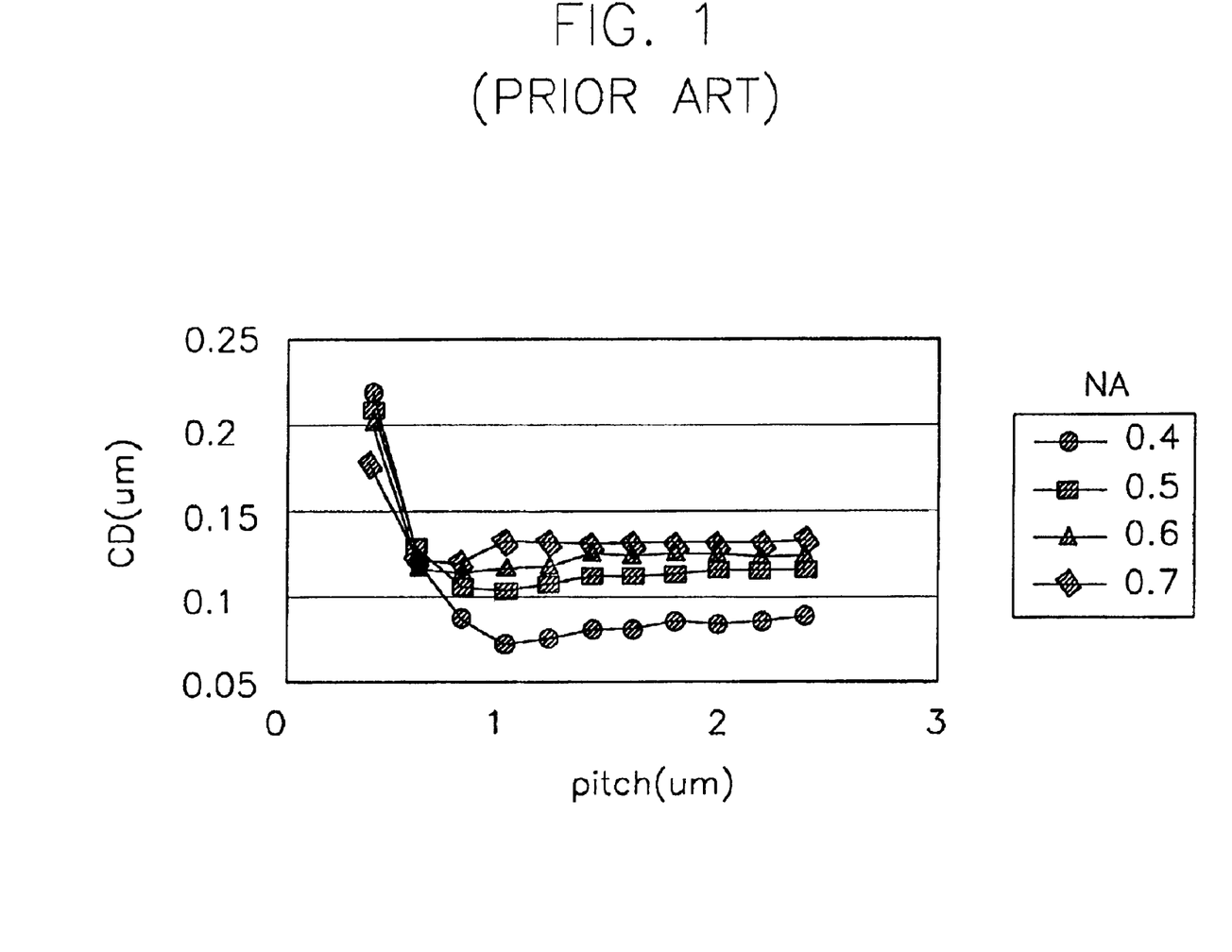
FIG. 1 is a graph showing the variation of a critical dimension as a function of a numerical aperture according to a conventional technique.

First, the method for optimizing parameters of an exposure device is used to optimize a partial coherence and a numerical aperture (NA) of a lens. One conventional technique for reducing the CD by optimizing the NA is shown in FIG. 1. That is, the depth of focus (DOF) is proportional to a wavelength of a beam and inversely proportional to the NA, so the DOF is reduced as the NA is increased.

Figure 2:
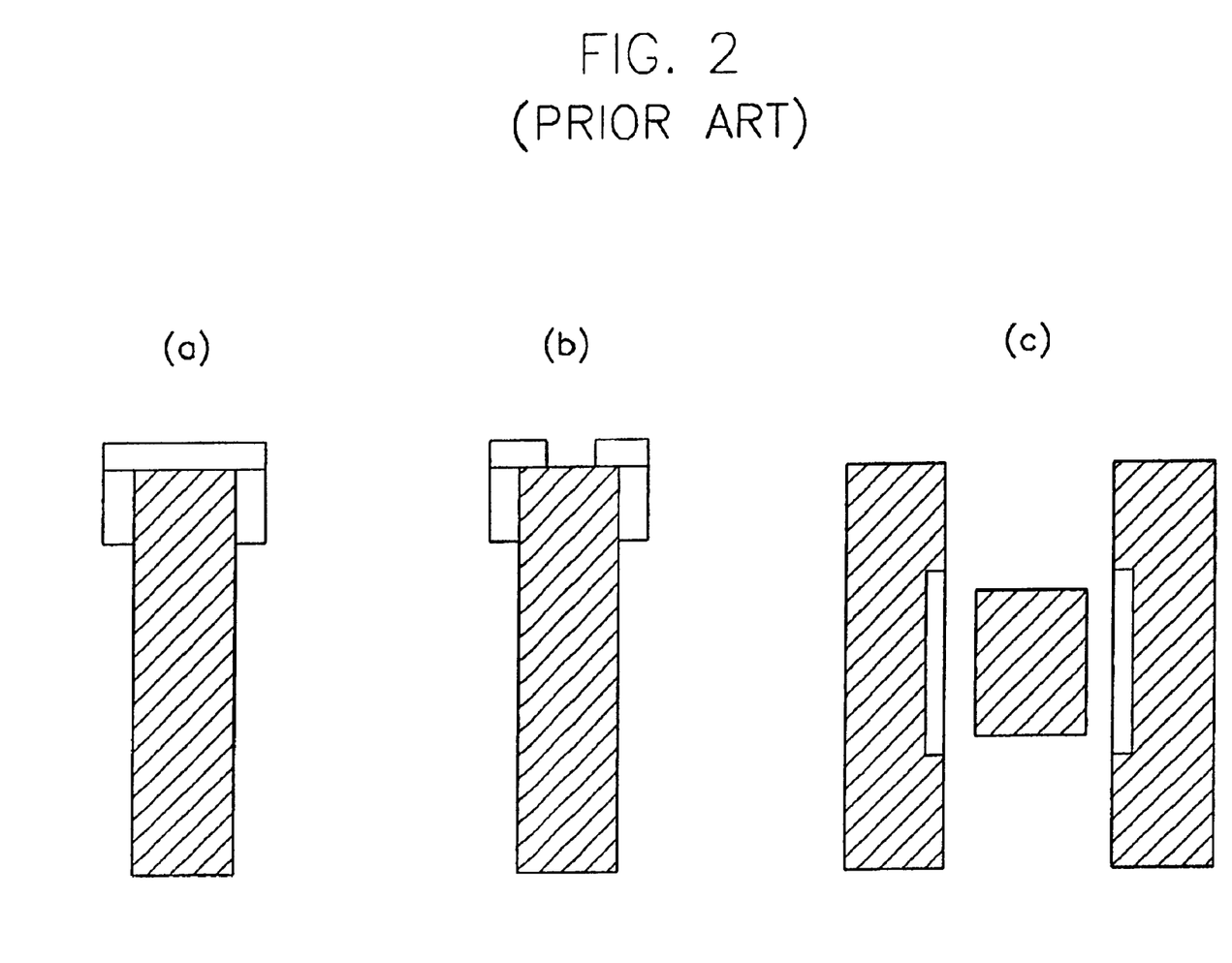
FIGS. 2a to 2c illustrate sectional views showing various methods for forming conventional bar-type auxiliary features for correcting an optical proximity effect.

Second, as shown in FIGS. 2a to 2c, the OPC method using an auxiliary pattern having a resolution below the limit-resolution includes a HAMMER-HEAD method (FIG. 2a) for preventing the length of a pattern from being shortened, a SERIF method (FIG. 2b) for correcting an edge effect, and a BIAS method (FIG. 2c) for forming a bias pattern at an edge. Hatching areas shown in FIGS. 2a to 2c represent features that are transcribed onto the wafer to form the pattern.

The gradient of the isolated edge is adjusted such that it matches the edge intensity gradient of a densely packed edge by means of the additional lines. As a result, the isolated features are transcribed in the same manner as in the densely packed features so that the optical proximity effect is greatly reduced.

Various techniques for correcting the proximity effect using the above-mentioned auxiliary features in the form of bars have been studied and are used in the field. The auxiliary features and patterns are misconceived as a pattern fault so that a pattern defect is detected. However, when the shape of patterns on the mask is complicated, the created patterns are not able to match the design rule. In an extreme case, the singularity inspection by means of a design rule checking (DRC) is impossible.

A method for using a phase shift mask (PSM) has been suggested. The PSM exposes the pattern using interrupted light or an interrupted part, thereby increasing the resolution and the depth of focus. That is, when the patterns are repeatedly formed, the phase of the light radiated from left and right openings is shifted by 180 degrees such that the light intensity of a light shielding section formed between openings is set to zero, which is significantly different from the light intensity of the openings, thereby adjusting the light intensity.

Another method uses a transmittance adjustment mask. The transmittance adjustment mask is provided to increase fidelity and the depth of focus by adjusting the transmittance of the light at a part of a mask pattern.

SUMMARY OF THE INVENTION

The present invention has been made to solve the above-mentioned problems of the prior art. Therefore, it is a first feature of an embodiment of the present invention to provide a transmittance adjustment mask (TAM) having dummy features that adjust light passing through peripheries of features such that light intensities formed on wafer areas corresponding to edges of densely packed features are about the same as light intensities formed on other wafer areas corresponding to edges of isolated features.

A second feature of an embodiment of the present invention is to provide a method for manufacturing the transmittance adjustment mask of the present invention.

To provide the first feature of an embodiment of the present invention, there is provided a transmittance adjustment mask for optically transcribing a pattern corresponding to integrated circuits onto a semiconductor substrate by using an exposure device. The transmittance adjustment mask includes a plurality of features corresponding to circuit elements that form the integrated circuits, the plurality of features having predetermined minimum dimensions and having an isolated edge and a plurality of dense edges, and at least one semi-transparent dummy feature. The at least one semi-transparent dummy feature is spaced parallel and apart from the isolated edge by a predetermined distance such that a first light intensity in a first area of the semiconductor substrate, corresponding to the plurality of dense edges of the plurality of features, is about the same as a second light intensity in a second area of the semiconductor substrate, corresponding to the isolated edge of the plurality of features, wherein the at least one semi-transparent dummy feature has the predetermined minimum dimensions.

The dummy feature includes a semi-transparent material having a light transmittance that prevents the dummy feature from being transcribed onto the semiconductor substrate as a pattern.

The predetermined distance between the isolated edge of the plurality of features and the dummy feature is larger than the predetermined minimum dimension. Preferably, the isolated edge of the plurality of features is spaced apart from an adjacent edge by at least three times the predetermined minimum dimension.

A plurality of semi-transparent dummy features may be provided, wherein the plurality of dummy features are spaced apart from each other by the predetermined minimum distance.

According to another embodiment of the present invention, there is provided a transmittance adjustment mask for optically transcribing a pattern corresponding to integrated circuits onto a semiconductor substrate by using an exposure device. The transmittance adjustment mask includes a plurality of features corresponding to circuit elements that form the integrated circuits, the plurality of features having predetermined minimum dimensions and having a plurality of edges, wherein the plurality of edges include dense edges, which are closely adjacent to other edges, and isolated edges, which are remote from other edges. The transmittance adjustment mask also includes a plurality of dummy features installed on the transmittance adjustment mask and spaced parallel and apart from a corresponding isolated edge by a predetermined distance in order to adjust a light transmittance in peripheral areas of the isolated edges such that a first light intensity in a first area of the semiconductor substrate corresponding to the isolated edges is about the same as a second light intensity in a second area of the semiconductor substrate corresponding to the dense edges, wherein the plurality of semi-transparent dummy features have the predetermined minimum dimensions.

To provide the second feature of an embodiment of the present invention, there is provided a method for manufacturing a transmittance adjustment mask for optically transcribing a pattern corresponding to integrated circuits onto a semiconductor substrate using an exposure device. The method includes depositing a light shielding layer on a mask substrate, patterning the light shielding layer to form a plurality of features corresponding to circuit elements that form the integrated circuits having predetermined minimum dimensions, the plurality of features having a plurality of edges, wherein the plurality of edges includes dense edges closely adjacent to other edges and isolated edges remote from the other edges, depositing a semi-transparent transmittance adjusting layer on the mask substrate formed with the plurality of features, and patterning the semi-transparent transmittance adjusting layer to form a plurality of dummy features on the transmittance adjustment mask that are spaced parallel and apart from a corresponding isolated edge by a predetermined distance in order to adjust a light transmittance in peripheral areas of the isolated edges such that a first light intensity in a first area of the semiconductor substrate corresponding to the isolated edges is about the same as a second light intensity in a second area of the semiconductor substrate corresponding to the dense edges, wherein the plurality of semi-transparent dummy features have the predetermined minimum dimensions.

According to another embodiment of the present invention, there is provided a method for manufacturing a transmittance adjustment mask for optically transcribing a pattern corresponding to integrated circuits onto a semiconductor substrate by using an exposure device, the method includes depositing a semi-transparent transmittance adjusting layer on a mask substrate, patterning the semi-transparent transmittance adjusting layer to form a plurality of dummy features having predetermined minimum dimensions and having a plurality of edges, wherein the plurality of edges includes dense edges closely adjacent to other edges and isolated edges remote from other edges, depositing a light shielding layer on a mask substrate formed with the plurality of dummy features, and patterning the light shielding layer to form a plurality of features corresponding to circuit elements that form the integrated circuits, the plurality of features are spaced parallel and apart from a corresponding isolated edge of the plurality of dummy features by a predetermined distance in order to adjust a light transmittance in peripheral areas of the isolated edges such that a first light intensity in a first area of the semiconductor substrate corresponding to the isolated edges is about the same as a second light intensity in a second area of the semiconductor substrate corresponding to the dense edges, wherein the plurality of semi-transparent dummy features have the predetermined minimum dimensions.

BRIEF DESCRIPTION OF THE DRAWINGS

The above features and other advantages of the present invention will become more apparent by describing in detail preferred embodiments thereof with reference to the attached drawings in which.

DETAILED DESCRIPTION OF THE INVENTION

Korean Patent Application No. 2001-19151, filed on Apr. 11, 2001, and entitled: "Mask for Adjusting Transmittance of a Light and Method for Manufacturing the Same," is incorporated by reference herein in its entirety.

Hereinafter, a preferred embodiment of the present invention will be described in detail with reference to accompanying drawings. It should be noted, however, that the following embodiments do not limit the scope of the present invention.

As a conventional photolithography process is well known in the art, a detailed description thereof will be omitted, and a detailed explanation of the present invention will follow.

Figure 3:
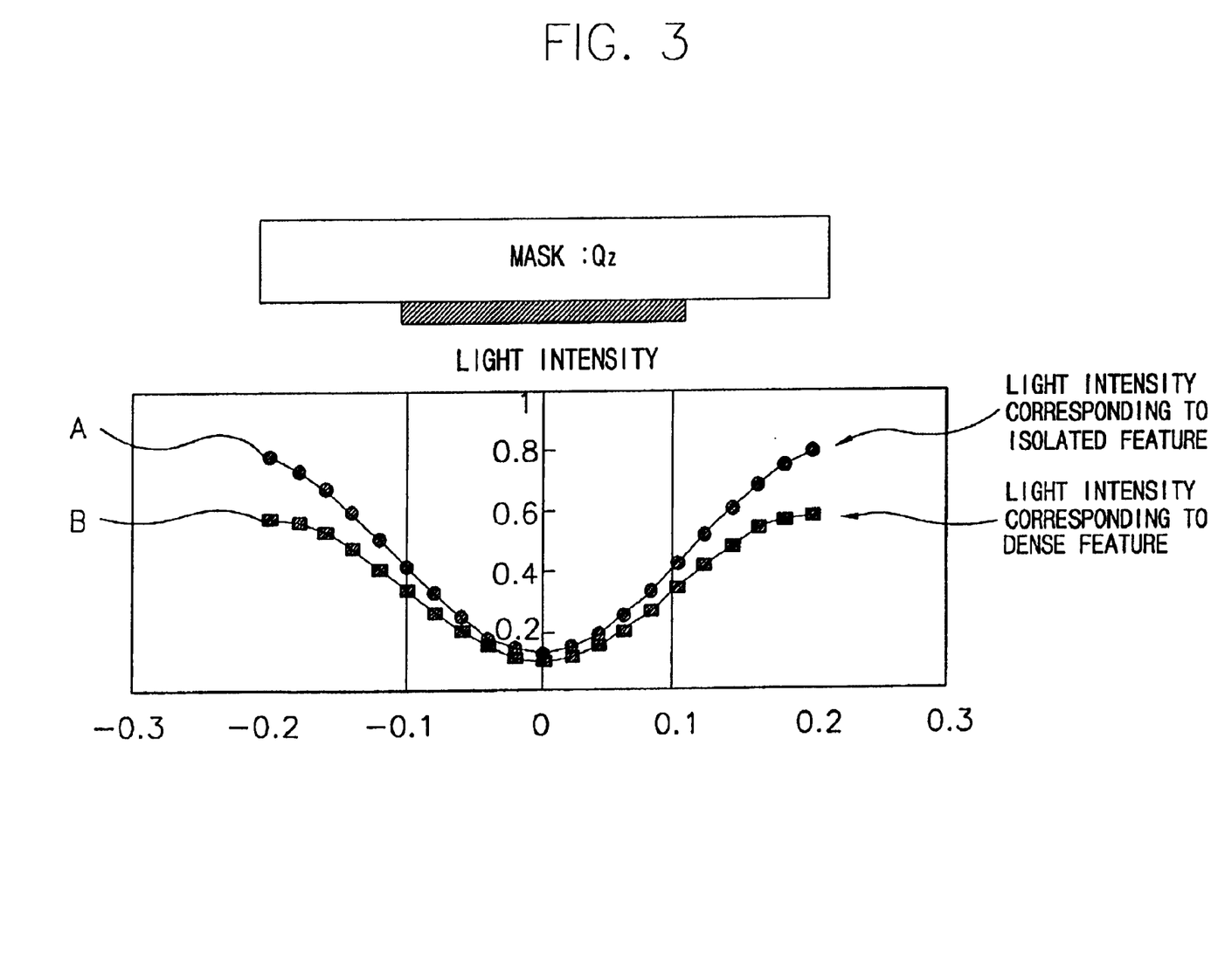
FIG. 3 is a graph showing light intensities of isolated features and densely packed features.

Referring to FIG. 3, a light intensity radiated onto a semiconductor substrate through features formed in a chrome binary mask is affected by a density of peripheral features. Isolated features spaced relatively far apart from peripheral features allow for large open areas in a peripheral region of a semiconductor substrate. By transmitting light through these large open areas in the peripheral region, a significant amount of light may be radiated onto the semiconductor substrate. This large amount of light affects the area of the semiconductor substrate corresponding to the isolated features causing light intensity to be high in that area (referred to as "A" in FIG. 3).

Conversely, when features are densely packed and closely adjacent to peripheral features, open areas of a peripheral region of a semiconductor substrate are narrow. Only a small amount of light is radiated onto the semiconductor substrate when light is transmitted through these narrow openings. Therefore, an area of the semiconductor substrate corresponding to densely packed features is less affected by the light radiated onto the peripheral areas, so the intensity of light is relatively low in the area corresponding to the densely packed features (referred to as "B" in FIG. 3).

Accordingly, since a photosensitive area of a photoresist varies according to the amount of light, sizes of photoresist patterns corresponding to densely packed features and isolated features are different. That is, a variation of the critical dimension occurs such that the design rule of isolated patterns corresponding to isolated features in edge areas is smaller than the design rule of densely packed patterns corresponding to densely packed features in edge areas. In other words, dimensions of patterns formed on a semiconductor substrate that are designed to be the same are actually different.

Therefore, the present invention adjusts the light transmittance at the peripheral areas of features such that the light intensity in semiconductor substrate areas corresponding to each edge may be uniformly formed regardless of the densely packed feature area and the isolated feature area. More specifically, the light intensities in the different semiconductor areas are made to be about the same by matching the amount of light passing through the peripheral areas of the densely packed features with the amount of light passing through the peripheral areas of the isolated features.

Figure 4:
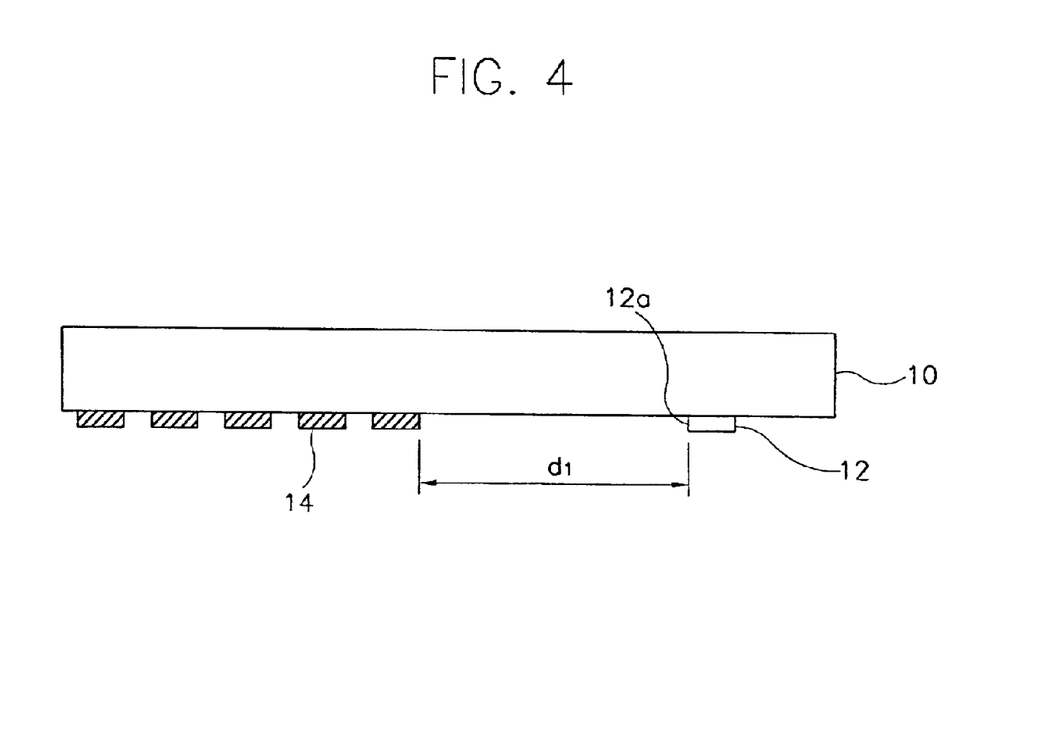
FIG. 4 illustrates a view showing dummy features installed at a periphery of a densely packed feature according to an embodiment of the present invention.
Figure 5:
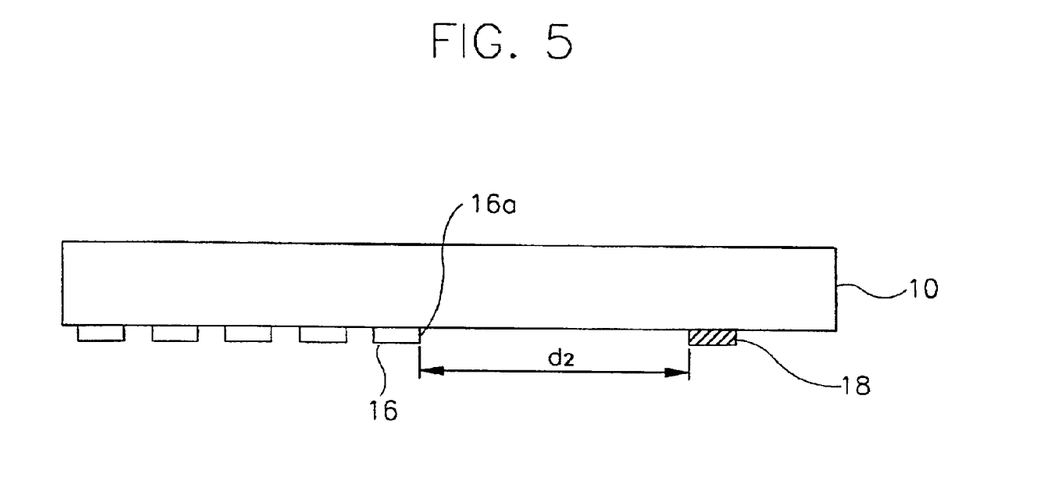
FIG. 5 illustrates a view showing dummy features installed at a periphery of an isolated feature according to an embodiment of the present invention.

Referring to FIGS. 4 and 5, dummy features having a relatively low density are formed at an outermost peripheral area of the densely packed features formed in the mask. In addition, dummy features having a relatively high density are formed at peripheral areas of the isolated features, thereby adjusting the amount of light passing through the peripheral areas of the densely packed features and the isolated features to be about the same.

Referring to FIG. 4, dummy features 14 are formed at peripheral areas of an isolated feature 12 formed on a mask substrate 10 such that the numerical aperture thereof is about the same as the numerical aperture of the densely packed feature area. Dummy features 14 are spaced apart from an edge 12a of the isolated feature 12 by a predetermined distance and are arranged parallel to the isolated feature 12. At this time, the spaced distance d1 is larger than the critical dimension of the isolated feature, preferably more than 1.1 times larger, to improve the depth of focus. Widths of dummy features 14 and an interval between the dummy features 14 are identical to the critical dimension of the densely packed features.

Referring to FIG. 5, a dummy feature 18 is formed to be spaced apart from an edge 16a of the outermost feature of densely packed features 16 formed on the mask substrate 10 such that the numerical aperture thereof is about the same as the numerical aperture of the isolated feature area. The dummy feature 18 is spaced apart from the edge 16a of the densely packed features 16 by a predetermined distance and is arranged parallel to the densely packed features 16. At this time, the spaced distance d2 is larger than the critical dimension of the densely packed feature, preferably more than 1.1 times larger, to improve the depth of focus.

Thus, as shown in FIGS. 4 and 5, by forming dummy features at peripheral areas of the isolated feature and the densely packed features, the present invention adjusts the light transmittance of the peripheral areas such that the numerical apertures in the isolated feature area and the densely packed feature area match each other.

Different from a scattering bar for the OPC having a design rule less than the limit-resolution, the dummy features of the present invention have a CD size to match the limit-resolution. Accordingly, the dummy features are preferably made of a semi-transparent material that transmits light to prevent the dummy feature from being transcribed onto the semiconductor substrate. The dummy wafer material should also be capable of adjusting the light transmittance in the peripheral areas.

Figure 6:
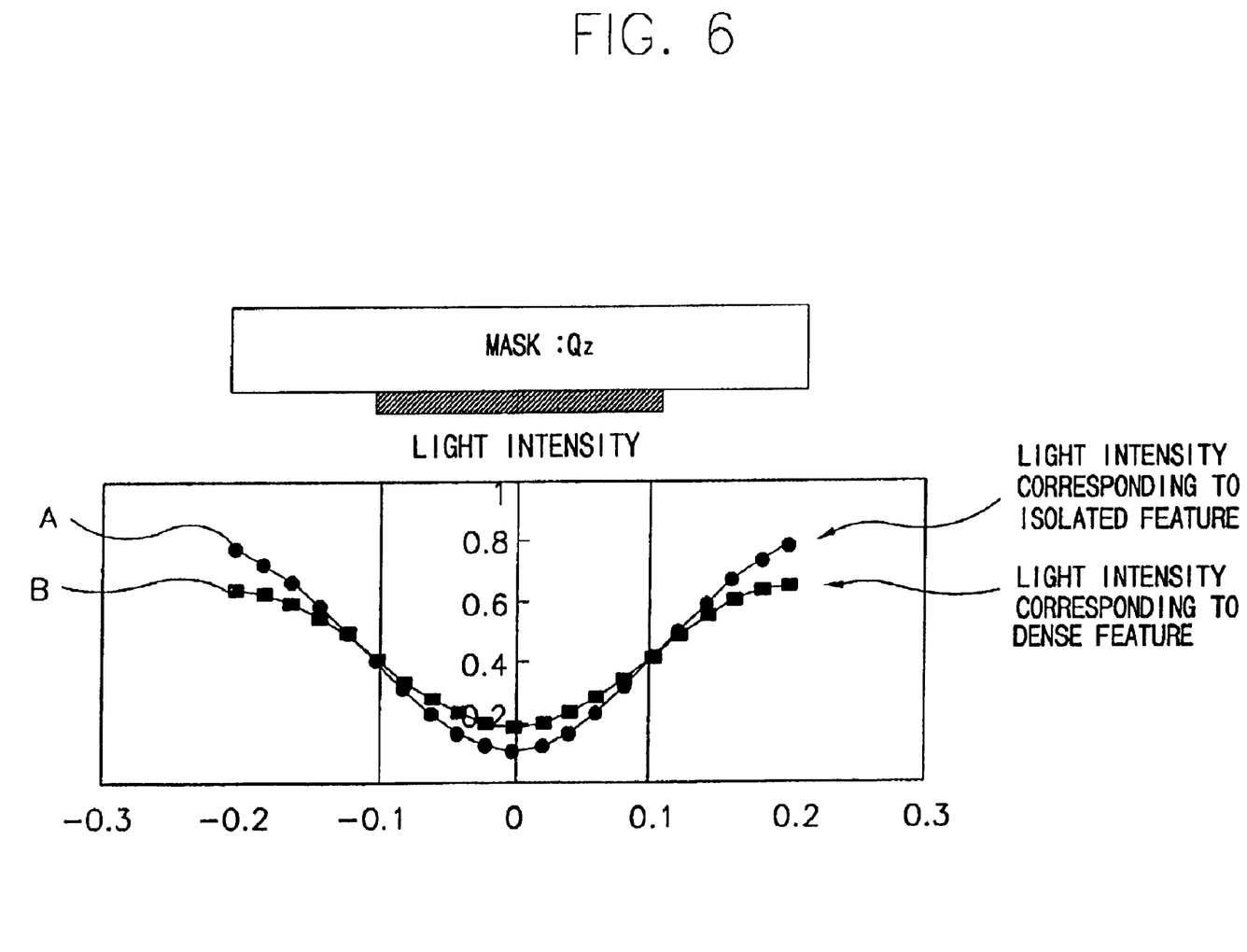
FIG. 6 is a graph showing light intensities of isolated features and densely packed features when a transmittance adjustment mask of the present invention is applied.

Referring to FIG. 6, the light intensities in the semiconductor substrate areas corresponding to edges of the isolated feature and the densely packed features may be generated to be constant by forming dummy features having a density corresponding to the peripheral areas of the densely packed features and the isolated feature, as shown in FIGS. 4 and 5.

That is, the dummy features are formed at the peripheral areas such that light intensities in the semiconductor areas corresponding to the edges of the densely packed features and the isolated feature are matched.

Hereinafter, an embodiment of a method for manufacturing the transmittance adjustment mask will be described with reference to FIGS. 7 to 14.

Figure 7:
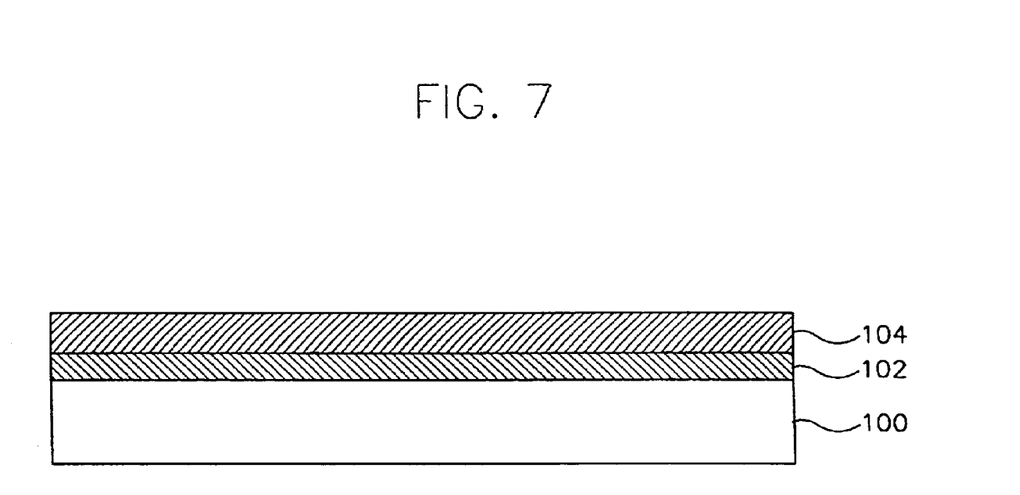
FIGS. 7 to 14 illustrate sectional views showing the manufacturing process of the transmittance adjustment mask according to an embodiment of the present invention.

Referring to FIG. 7, a binary chrome blank mask, on which a light shielding layer 102 made of chrome and a photoresist layer 104 are sequentially stacked, is provided on a mask substrate 100.

Figure 8:
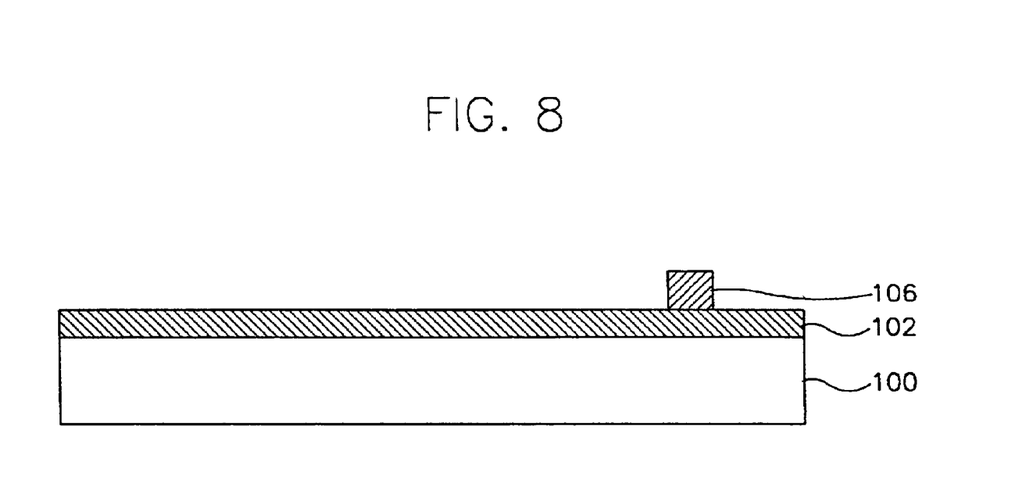

Referring to FIG. 8, a photoresist pattern 106 is formed by exposing and developing the photoresist layer (104 of FIG. 7) of the blank mask.

Figure 9:
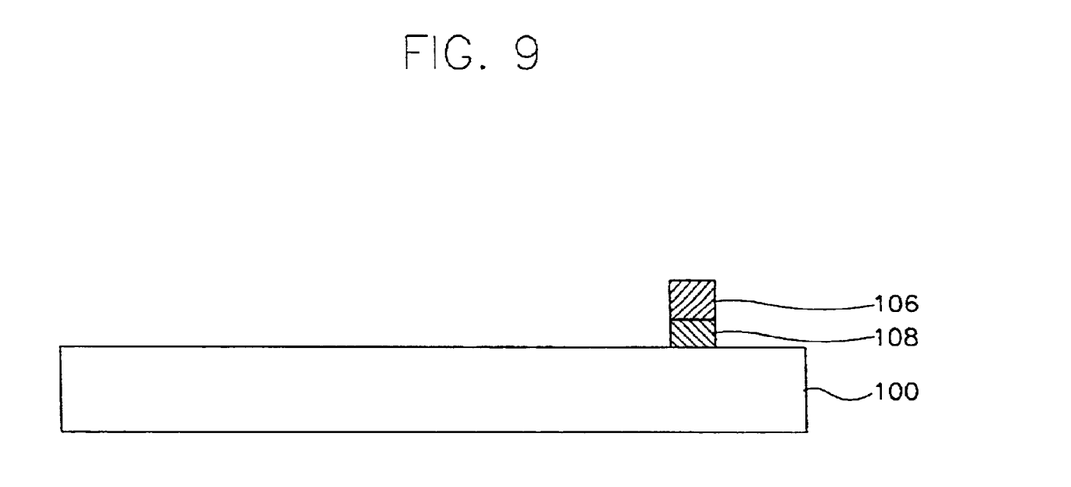

Referring to FIG. 9, the light shielding layer (102 of FIG. 8) is patterned by etching the light shielding layer using the photoresist pattern 106 as an etching mask. Then, a feature 108 made of chrome is formed on the mask substrate 100 by removing the photoresist pattern 106.

Figure 10:
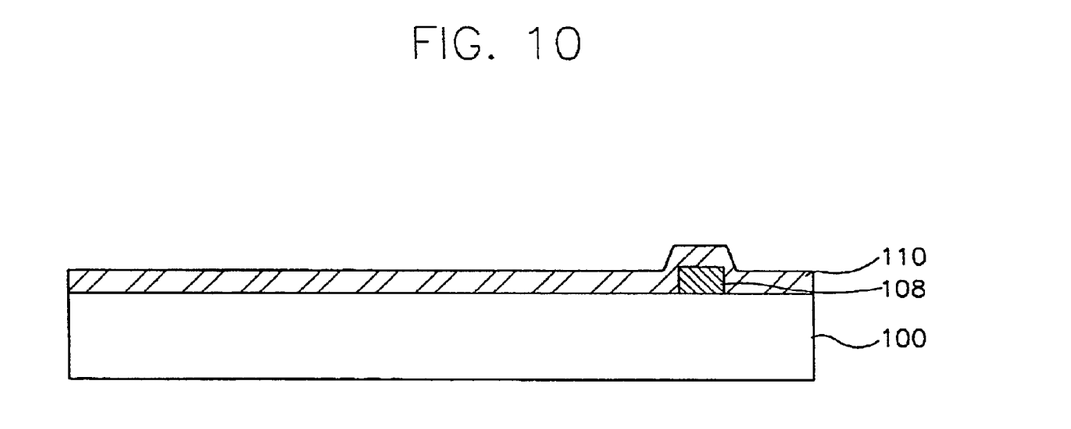
Figure 11:
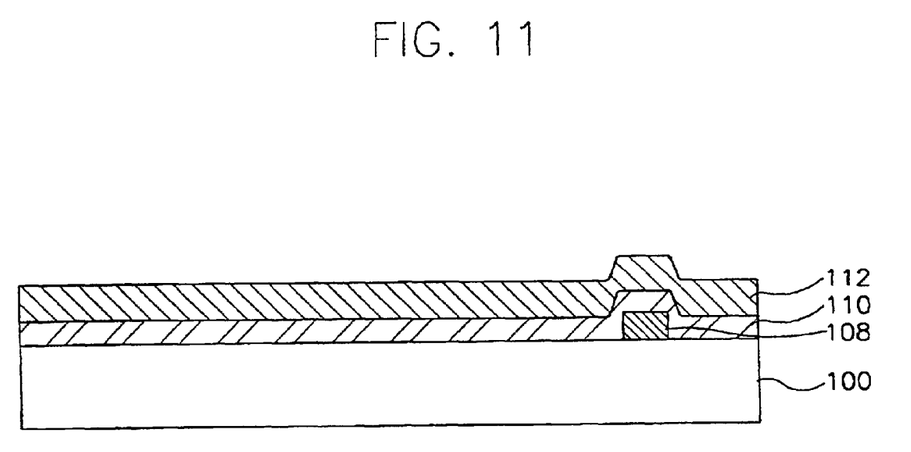
Figure 12:
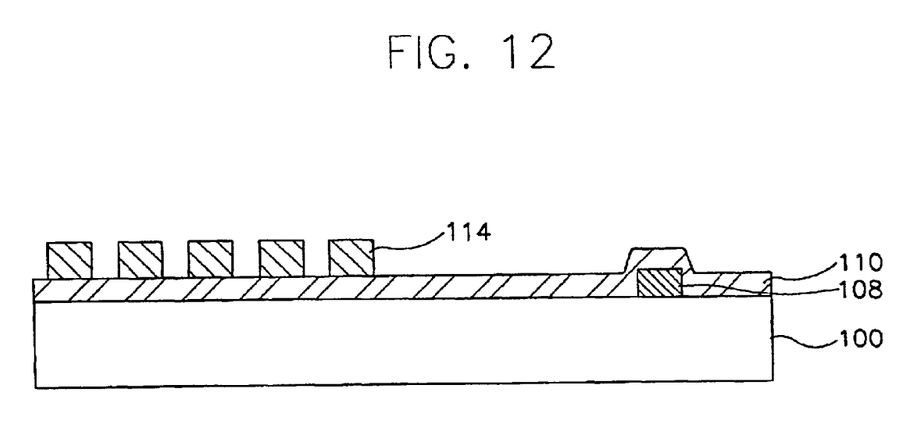

Referring to FIG. 10, a transmittance adjusting layer 110 is formed on the mask substrate 100. The transmittance adjusting layer 110 is made of a semi-transparent material which partially transmits the light. Referring to FIG. 11, a photoresist layer 112 is formed on the transmittance adjusting layer 110. Then, as shown in FIG. 12, a photoresist pattern 114 is formed by exposing and developing the photoresist layer 112.

Figure 13:
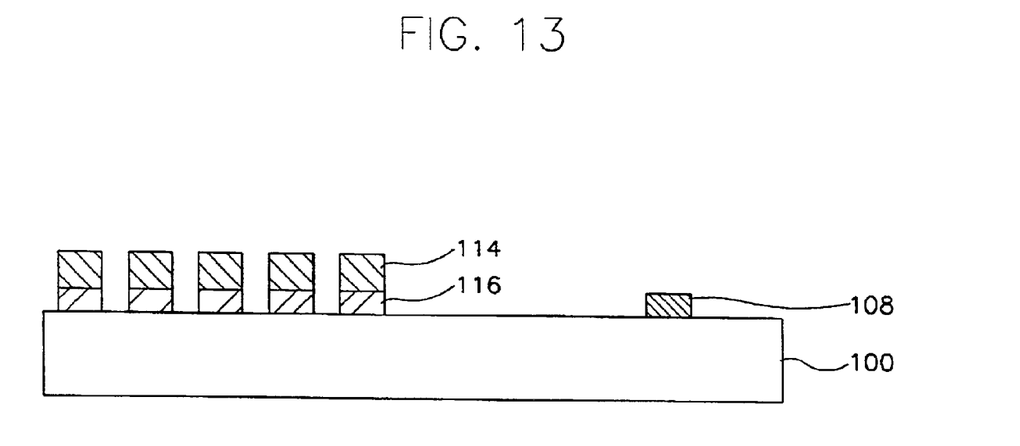
Figure 14:
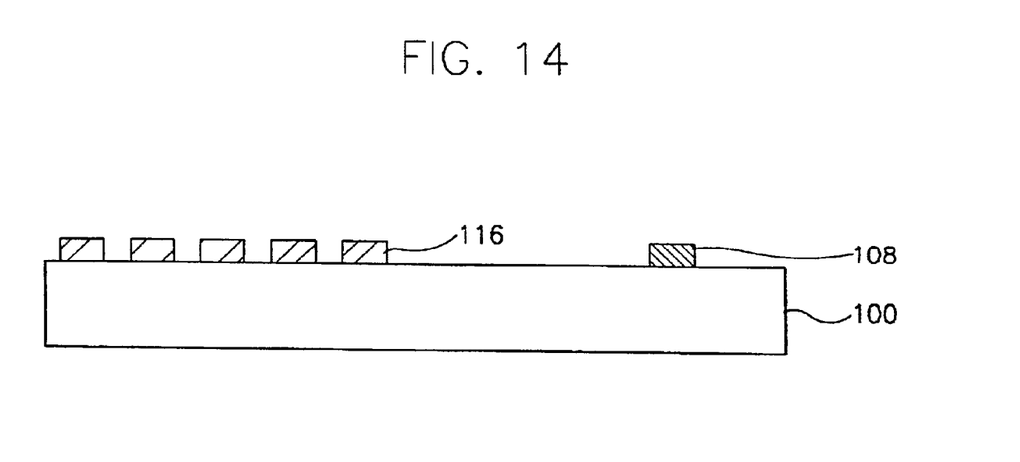

Referring to FIG. 13, the transmittance adjusting layer (110 of FIG. 12) is patterned by using the photoresist pattern 114 as an etching mask. Then, the photoresist pattern 114 is removed, so the dummy features 116 for adjusting the transmittance of the light are formed at the peripheral area of the feature as shown in FIG. 14.

Though the present invention has been described with reference to preferred embodiments thereof, the present invention may be achieved using various other methods. For example, it is possible to form the features subsequent to the fabrication of the dummy features for adjusting the transmittance of the light.

As described above, the transmittance adjustment mask of the present invention adjusts the amount of light radiated onto the peripheral areas of the isolated feature and the densely packed features to be about the same based on the density of the dummy features, so the light intensity corresponding to the edges of the densely packed features is about the same as the light intensity corresponding to the edge of the isolated feature. Therefore, the CD of the densely packed pattern and the isolated pattern, which are formed on the wafer, may be formed uniformly.

In addition, since the CD of the dummy features is identical to the CD of the main features, the mask may be simply designed and design inspection easily carried out.

While the present invention has been described in detail with reference to the preferred embodiments thereof, and although specific terms are employed, they are used in a generic and descriptive sense only and not for the purpose of limitation. Accordingly, it will be understood by those of ordinary skill in the art that various changes, substitutions and alterations in form and details may be made without departing from the spirit and scope of the invention as set forth in the following claims.

What is claimed is:

1. A transmittance adjustment mask for optically transcribing a pattern corresponding to integrated circuits onto a semiconductor substrate by using an exposure device, the transmittance adjustment mask comprising:
   a plurality of features corresponding to circuit elements that form the integrated circuits, the plurality of features having predetermined minimum dimensions and having an isolated edge and a plurality of dense edges; and
   at least one uniformly semi-transparent dummy feature, which is spaced parallel and apart from the isolated edge of the plurality of features by a predetermined distance such that a first light intensity in a first area of the semiconductor substrate, corresponding to the plurality of dense edges of the plurality of features, is about the same as a second light intensity in a second area of the semiconductor substrate, corresponding to the isolated edge of the plurality of features, wherein the at least one semi-transparent dummy feature has the predetermined minimum dimensions.

2. The transmittance adjustment mask as claimed in claim 1, wherein the at least one semi-transparent dummy feature is made of a semi-transparent material having a light transmittance that prevents the dummy feature from being transcribed onto the semiconductor substrate as a pattern.

3. The transmittance adjustment mask as claimed in claim 1, wherein the predetermined distance between the isolated edge of the plurality of features and the dummy feature is larger than the predetermined minimum dimension.

4. The transmittance adjustment mask as claimed in claim 1, wherein the isolated edge of the plurality of features is spaced apart from an adjacent edge by at least three times the predetermined minimum dimension.

5. The transmittance adjustment mask as claimed in claim 1, further comprising a plurality of uniformly semi-transparent dummy features, wherein the plurality of uniformly semi-transparent dummy features are spaced apart from each other by the predetermined minimum dimension.

6. The transmittance adjustment mask as claimed in claim 1, wherein the predetermined distance is at least 1.1 times larger than the predetermined minimum dimension.

7. A transmittance adjustment mask for optically transcribing a pattern corresponding to integrated circuits onto a semiconductor substrate by using an exposure device, the transmittance adjustment mask comprising:
   a plurality of features corresponding to circuit elements of the integrated circuits, the plurality of features having predetermined minimum dimensions and having a plurality of edges, wherein the plurality of edges include dense edges, which are closely adjacent to other edges, and isolated edges, which are remote from other edges; and
   a plurality of uniformly semi-transparent dummy features which are installed on the transmittance adjustment mask and are spaced parallel and apart from a corresponding isolated edge by a predetermined distance in order to adjust a light transmittance in peripheral areas of the isolated edges such that a first light intensity in a first area of the semiconductor substrate corresponding to the isolated edges is about the same as a second light intensity in a second area of the semiconductor substrate corresponding to the dense edges, wherein the plurality of uniformly semi-transparent dummy features have the predetermined minimum dimensions.

8. The transmittance adjustment mask as claimed in claim 7, wherein the dummy features are made of a semi-transparent material having a light transmittance that prevents the dummy features from being transcribed onto the semiconductor substrate as a pattern.

9. The transmittance adjustment mask as claimed in claim 7, wherein the predetermined distance is larger than the predetermined minimum dimension.

10. The transmittance adjustment mask as claimed in claim 7, wherein the predetermined distance is at least 1.1 times larger than the predetermined minimum dimension.

11. The transmittance adjustment mask as claimed in claim 7, wherein the isolated edge is spaced apart from an adjacent edge by at least three times the predetermined minimum dimension.

12. The transmittance adjustment mask as claimed in claim 7, wherein the dummy features are spaced apart from each other by the predetermined minimum dimension.

13. A method for manufacturing a transmittance adjustment mask for optically transcribing a pattern corresponding to integrated circuits onto a semiconductor substrate by using an exposure device, the method comprising:
   depositing a light shielding layer on a mask substrate;
   patterning the light shielding layer to form a plurality of features corresponding to circuit elements that form the integrated circuits having predetermined minimum dimensions, the plurality of features having a plurality of edges, wherein the plurality of edges includes dense edges closely adjacent to other edges and isolated edges remote from other edges;
   depositing a semi-transparent transmittance adjusting layer on the mask substrate formed with the plurality of features; and patterning the semi-transparent transmittance adjusting layer to form a plurality of uniformly semi-transparent dummy features on the transmittance adjustment mask that are spaced parallel and apart from a corresponding isolated edge by a predetermined distance in order to adjust a light transmittance in peripheral areas of the isolated edges such that a first light intensity in a first area of the semiconductor substrate corresponding to the isolated edges is about the same as a second light intensity in a second area of the semiconductor substrate corresponding to the dense edges, wherein the plurality of uniformly semi-transparent dummy features have the predetermined minimum dimensions.

14. The method for manufacturing a transmittance adjustment mask as claimed in claim 13, wherein the predetermined distance is larger than the predetermined minimum dimension.

15. The method for manufacturing a transmittance adjustment mask as claimed in claim 13, wherein the predetermined distance is at least 1.1 times larger than the predetermined minimum dimension.

16. The method for manufacturing a transmittance adjustment mask as claimed in claim 13, wherein the isolated edge is spaced apart from an adjacent edge by at least three times the predetermined minimum dimension.

17. The method for manufacturing a transmittance adjustment mask as claimed in claim 13, wherein the dummy features are spaced apart from each other by the predetermined minimum dimension.

18. A method for manufacturing a transmittance adjustment mask for optically transcribing a pattern corresponding to integrated circuits onto a semiconductor substrate by using an exposure device, the method comprising:

depositing a semi-transparent transmittance adjusting layer on a mask substrate;

patterning the semi-transparent transmittance adjusting layer to form a plurality of uniformly semi-transparent dummy features having predetermined minimum dimensions and having a plurality of edges, wherein the plurality of edges includes dense edges, which are closely adjacent to other edges, and isolated edges, which are remote from other edges;

depositing a light shielding layer on a mask substrate formed with the plurality of dummy features; and patterning the light shielding layer to form a plurality of features corresponding to circuit elements that form the integrated circuits, the plurality of features are spaced parallel and apart from a corresponding isolated edge of the plurality of uniformly semi-transparent dummy features by a predetermined distance in order to adjust a light transmittance in peripheral areas of the isolated edges such that a first light intensity in a first area of the semiconductor substrate corresponding to the isolated edges is about the same as a second light intensity in a second area of the semiconductor substrate corresponding to the dense edges, wherein the plurality of features have the predetermined minimum dimensions.

19. The method for manufacturing a transmittance adjustment mask as claimed in claim 18, wherein the predetermined distance is larger than the predetermined minimum dimension.

20. The method for manufacturing a transmittance adjustment mask as claimed in claim 18, wherein the predetermined distance is at least 1.1 times larger than the predetermined minimum dimension.

21. The method for manufacturing a transmittance adjustment mask as claimed in claim 18, wherein the isolated edge is spaced apart from an adjacent edge by at least three times the predetermined minimum dimension.

22. The method for manufacturing a transmittance adjustment mask as claimed in claim 18, wherein the dummy features are spaced apart from each other by the predetermined minimum dimension.

* * * * *